(12) United States Patent
Kwon et al.

(10) Patent No.: US 11,820,043 B2
(45) Date of Patent: Nov. 21, 2023

(54) DISPLAY DEVICE AND METHOD OF MANUFACTURING COVER MEMBER

(71) Applicant: SAMSUNG DISPLAY CO., LTD., Yongin-si (KR)

(72) Inventors: Jaejoong Kwon, Suwon-si (KR); Hyesog Lee, Osan-si (KR); Yunseon Do, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 506 days.

(21) Appl. No.: 16/812,099

(22) Filed: Mar. 6, 2020

(65) Prior Publication Data
US 2020/0210039 A1    Jul. 2, 2020

Related U.S. Application Data

(62) Division of application No. 15/158,497, filed on May 18, 2016, now Pat. No. 10,599,321.

(30) Foreign Application Priority Data

Aug. 13, 2015  (KR) .......................... 10-2015-0114875

(51) Int. Cl.
*B29B 11/08*   (2006.01)
*G06F 3/0488*  (2022.01)
(Continued)

(52) U.S. Cl.
CPC .............. *B29B 11/08* (2013.01); *B29B 11/00* (2013.01); *B29B 11/06* (2013.01);
(Continued)

(58) Field of Classification Search
CPC ... B29C 70/72; B29C 70/70; B29C 45/14819; B29C 44/1266; B29C 2043/182; B29C 2045/0067; B29C 45/0062; B29C 14/14819; B29C 2045/1454; B29C 2045/14442; B29C 45/14385; B29C 45/14377; B29C 45/14196; B29C 45/14; B29C 44/32; B29C 44/12; B29C 37/0025;
(Continued)

(56) References Cited

U.S. PATENT DOCUMENTS 7,912,508 B2   3/2011   Lee et al.
9,250,656 B2   2/2016   Hirai et al.
(Continued)

FOREIGN PATENT DOCUMENTS

CN   103594024 A   2/2014
CN   103730061 A   4/2014
(Continued)

*Primary Examiner* — Stella K Yi
(74) *Attorney, Agent, or Firm* — Lewis Roca Rothgerber Christie LLP

(57) ABSTRACT

A display device includes a display member configured to display an image in a first direction and a cover member on the display member. The cover member includes a flexible member including a front part defining a front plane perpendicular to the first direction, and a first side part connected to a first side of the front part and defining a first side plane different from the front plane, and a rigid member partially overlapping the flexible member and on the front part.

8 Claims, 16 Drawing Sheets

(51) Int. Cl.

| | |
|---|---|
| *G06F 3/04886* | (2022.01) |
| *G09G 5/00* | (2006.01) |
| *G06F 1/16* | (2006.01) |
| *G06F 3/0483* | (2013.01) |
| *G06F 3/04883* | (2022.01) |
| *B29B 11/00* | (2006.01) |
| *B29C 61/06* | (2006.01) |
| *B29B 11/06* | (2006.01) |
| *B29C 45/14* | (2006.01) |
| *H10K 77/10* | (2023.01) |
| *H01L 27/12* | (2006.01) |
| *H10K 59/00* | (2023.01) |

(52) U.S. Cl.
CPC .. *B29C 45/14065* (2013.01); *B29C 45/14467* (2013.01); *B29C 61/06* (2013.01); *B29C 61/0608* (2013.01); *G06F 1/1652* (2013.01); *G06F 3/0483* (2013.01); *G06F 3/0488* (2013.01); *G06F 3/04883* (2013.01); *G06F 3/04886* (2013.01); *G09G 5/00* (2013.01); *H10K 77/111* (2023.02); *B29C 2045/1454* (2013.01); *B29C 2045/14114* (2013.01); *B29K 2995/0026* (2013.01); *G06F 1/1601* (2013.01); *G06F 1/165* (2013.01); *G06F 1/1626* (2013.01); *G06F 2203/0339* (2013.01); *G06F 2203/04102* (2013.01); *G06F 2203/04803* (2013.01); *G06F 2203/04808* (2013.01); *G09G 2380/02* (2013.01); *H01L 27/1218* (2013.01); *H10K 59/00* (2023.02); *Y02E 10/549* (2013.01); *Y02P 70/50* (2015.11)

(58) Field of Classification Search
CPC ..... B29C 37/001; B29C 33/12; B29C 31/008; B29C 61/06; B29C 45/14467; B29C 45/14008; B29C 45/14065
See application file for complete search history.

(56) References Cited

U.S. PATENT DOCUMENTS

| | | | |
|---|---|---|---|
| 9,300,772 | B2 | 3/2016 | Kim |
| D762,205 | S | 7/2016 | Dang et al. |
| 9,398,706 | B2 | 7/2016 | Choi et al. |
| 9,977,923 | B2 | 5/2018 | Lee |
| 9,989,790 | B2 | 6/2018 | Yang et al. |
| 10,028,339 | B2 | 7/2018 | Jung et al. |
| 2010/0014232 | A1* | 1/2010 | Nishimura ........... H05K 5/0017 65/102 |
| 2010/0089527 | A1* | 4/2010 | Lee ........................ B27M 3/34 156/219 |
| 2012/0118628 | A1* | 5/2012 | Pakula ................ H04M 1/0266 156/242 |
| 2013/0026678 | A1* | 1/2013 | Qin .................. B29C 45/14778 425/129.1 |
| 2013/0076649 | A1 | 3/2013 | Myers et al. |
| 2014/0202916 | A1* | 7/2014 | Kanda .................... A45C 11/00 206/524.3 |
| 2015/0189769 | A1* | 7/2015 | Chang ............... B29C 45/14434 312/223.1 |

FOREIGN PATENT DOCUMENTS

| | | |
|---|---|---|
| CN | 104064119 A | 9/2014 |
| CN | 104330906 A | 2/2015 |
| CN | 104553184 A | 4/2015 |
| CN | 105138074 A | 12/2015 |
| EP | 2 218 698 A1 | 8/2010 |
| KR | 10-2013-0013767 A | 2/2013 |
| KR | 10-2014-0066253 A1 | 3/2013 |
| KR | 10-2014-0063228 A | 5/2014 |
| KR | 10-2014-0142418 A | 12/2014 |
| KR | 10-2015-0001155 A | 1/2015 |
| KR | 10-2015-0004496 A | 1/2015 |
| KR | 10-2015-0006932 A | 1/2015 |
| KR | 10-2015-0017819 A | 2/2015 |
| WO | WO 2015/037822 A1 | 3/2015 |

\* cited by examiner

DISPLAY DEVICE AND METHOD OF MANUFACTURING COVER MEMBER

CROSS-REFERENCE TO RELATED APPLICATIONS

This application is a divisional of U.S. patent application Ser. No. 15/158,497, filed May 18, 2016, which claims priority to and the benefit of Korean Patent Application No. 10-2015-0114875, filed Aug. 13, 2015, the entire content of both of which is incorporated herein by reference.

BACKGROUND

1. Field

The present disclosure relates to a display device and a method of manufacturing a cover member thereof.

2. Description of the Related Art

Electronic equipment for providing an image to a user, such as smartphones, digital cameras, laptop computers, navigation devices, and smart televisions, includes an image display device for displaying an image. The image display device includes a display panel for generating an image to display the generated image and a window disposed above the display panel to protect the display panel.

Various display devices are being developed. Such display devices may display an image in various directions in one apparatus.

A window applied to the display device may have proper rigidity to protect inner components against an external impact and may also have a shape corresponding to that of the display device.

The above information disclosed in this Background section is only to enhance the understanding of the background of the described technology and therefore it may contain information that does not form prior art.

SUMMARY

Embodiments of the present disclosure provide a display device having a bent portion that defines a curved surface and may display an image in various directions, thereby improving reliability.

Embodiments of the present disclosure also provide a cover member having rigidity and ductility.

One or more embodiments of the present inventive concept provide a display device including: a display configured to display an image in a first direction; and a cover member on the display.

The cover member includes: a flexible member including a front part defining a front plane perpendicular to the first direction, and a first side part connected to one side of the front part and defining a first side plane different from the front plane; and a rigid member partially overlapping the flexible member and on the front part.

In some embodiments, the rigid member may include a glass substrate.

In some embodiments, the flexible member may include a polymer.

In some embodiments, the flexible member may include an adhesive.

In some embodiments, the flexible member may include a plastic substrate.

In some embodiments, an adhesive member may be between the flexible member and the rigid member.

In some embodiments, the first side part may have a curved surface.

In some embodiments, the first side part may have a flat surface defining a first flat plane crossing the front plane.

In some embodiments, the rigid member may include: a first rigid member on the front plane; and a second rigid member spaced apart from the first rigid member and on the first flat plane.

In some embodiments, a first surface of the front part may define a first recess part recessed in a thickness direction thereof, and the first rigid member may be located in the first recess part.

In some embodiments, a depth of the first recess part may be substantially the same as a thickness of the first rigid member.

In some embodiments, a first surface of the side part may define a second recess part recessed in a thickness direction thereof, and the second rigid member may be located in the second recess part.

In some embodiments, the first side part may include: a flat part defining the first flat plane; and a connection part connecting the first flat part and the front part.

In some embodiments, the connection part may define a curved surface.

In some embodiments, the flexible member may further include a second side part connecting another side of the front part, and the second side part may define a second side plane different from the front plane.

In some embodiments, the second side part may have a curved surface.

In some embodiments, the rigid member may further include a third rigid member, the second side part may define a second flat plane different from the front plane, and the third rigid member may be located on the second flat plane.

In some embodiments, the first flat plane may be parallel to the second flat plane.

In some embodiments, the display member may include a first display part corresponding to the front part; a second display part corresponding to the first side part; and a third display part corresponding to the second side part, and images which the first, the second, and the third display parts display respectively may penetrate the front part, the first side part, and the second side part.

In some embodiments, the first display part and the second display part may display images in directions that are opposite to each other.

In some embodiments, the first display part and the second display part may display images in directions which are perpendicular to each other.

In some embodiments, the display member may include a first sub-display member corresponding to the front part, a second sub-display member corresponding to the first side part, and a third sub-display member corresponding to the third side part.

In some embodiments of the present inventive concept, a method of manufacturing a cover member includes: providing a lower mold defining a first inner space; providing a rigid member in the first inner space; providing an upper mold on the lower mold to define a second inner space different from the first inner space; injecting a liquid polymer into the second inner space; curing the liquid polymer to form a cover member; and separating the cover member from the upper and lower molds.

In some embodiments, the first inner space may be defined by a planar surface of the lower mold and side surfaces bent from the planar surface in a first direction to surround the planar surface, and the rigid member may be on the planar surface.

In some embodiments, the rigid member may include: a first rigid member on the planar surface; a second rigid member on one of the side surfaces; and a third rigid member on one of the side surfaces on which the second rigid member is located.

In some embodiments, each of the first and second rigid members may include a first surface configured to contact the mold, a second surface opposite to the first surface, and a plurality of connection surfaces configured to connect the first surface to the second surface, and the liquid polymer may be injected into the second inner space to contact the second surface and the connection surfaces.

In some embodiments, the liquid polymer may be filled into a region of the second inner space around the rigid members.

In some embodiments, a shape of the cover member may correspond to that of the second inner space.

In one or more embodiments of the present inventive concept, a method of manufacturing a cover member includes: providing a plurality of rigid members; forming a flexible member including a plane part defining a first recess part, a first bent part bent from a first side of the plane part in a first direction and defining a second recess part, and a second bent part bent from a second side of the plane in the first direction, the second bend part defining a third recess part; and respectively coupling the plurality of rigid members to the first, second, and third recess parts to form the cover member.

In some embodiments, the flexible member may be formed by injection-molding a polymer.

In some embodiments, each of the first and second recess parts may have a depth that is substantially the same as a thickness of each of the rigid members.

BRIEF DESCRIPTION OF THE DRAWINGS

The accompanying drawings are included to provide a further understanding of the present inventive concept, and are incorporated in and constitute a part of this specification. The drawings illustrate exemplary embodiments of the present inventive concept and, together with the description, serve to explain principles of the present inventive concept. In the drawings.

DETAILED DESCRIPTION

Figure 1:
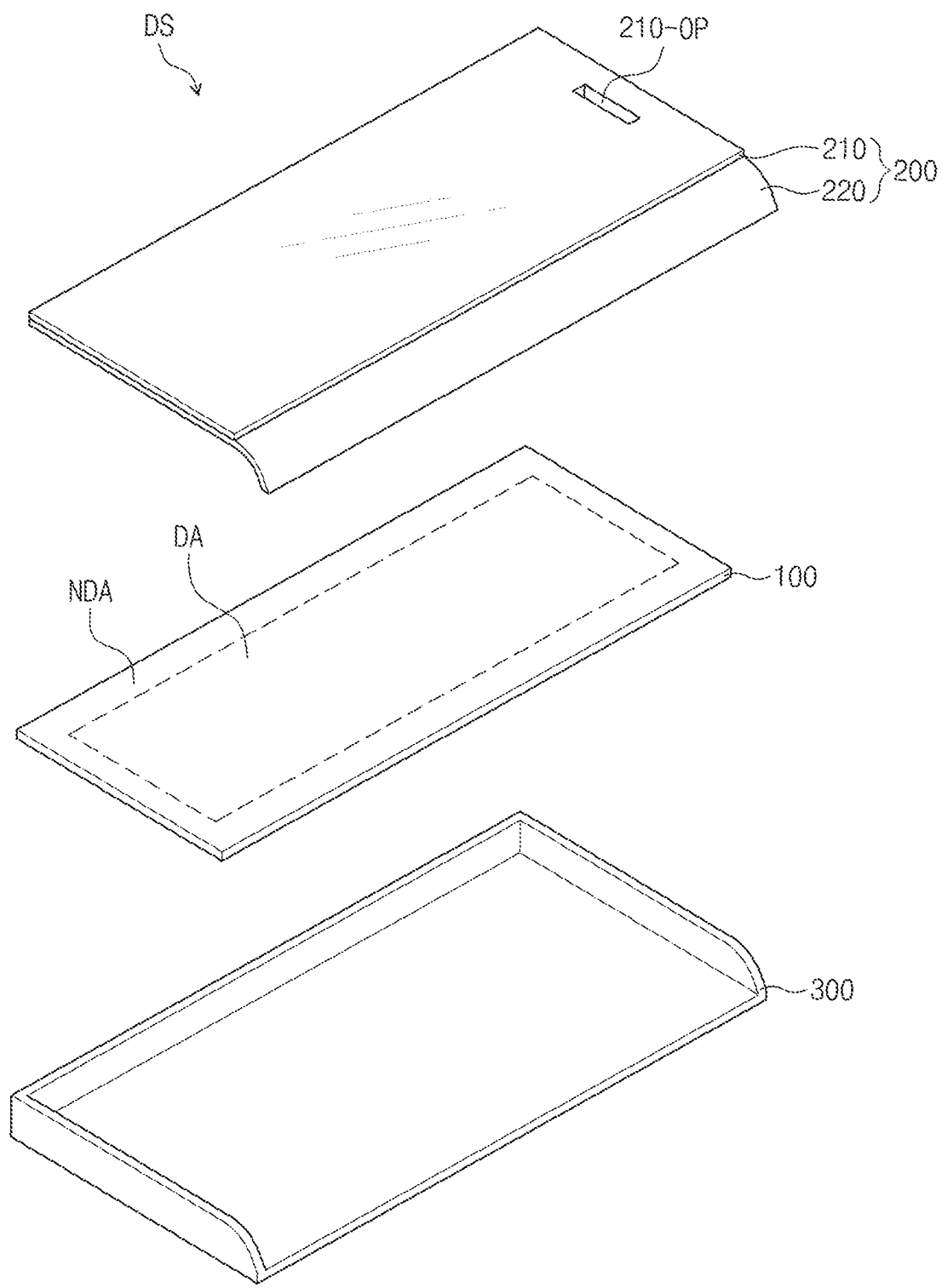
FIG. 1 is an exploded perspective view of a display device according to one or more exemplary embodiments of the present inventive concept.

Hereinafter, a display device according to one or more exemplary embodiments of the present inventive concept is described with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the present inventive concept to those skilled in the art. Accordingly, processes, elements, and techniques that are not necessary to those having ordinary skill in the art for a complete understanding of the aspects and features of the present inventive concept may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2A:
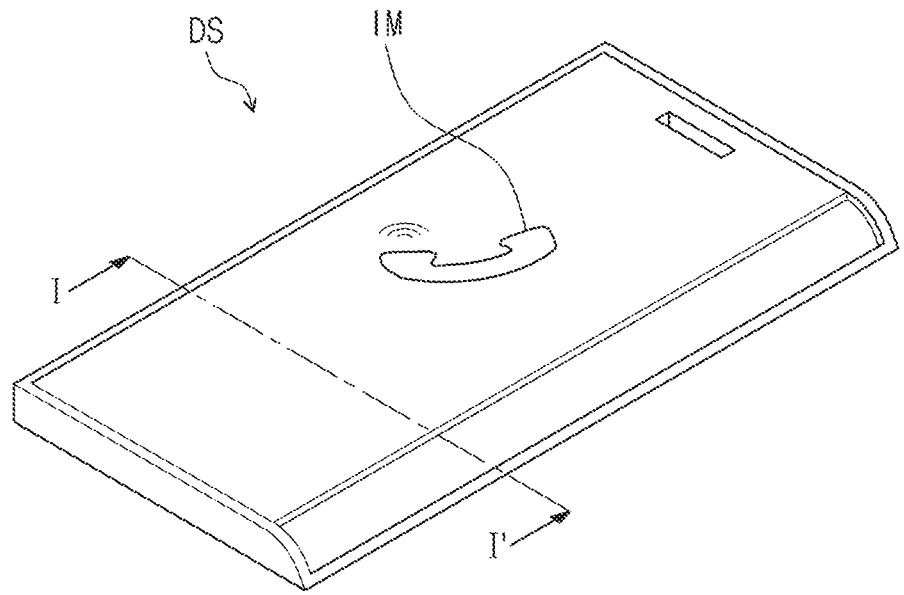
FIG. 2A is a perspective view of the display device of FIG. 1 in a coupled state.
Figure 2B:
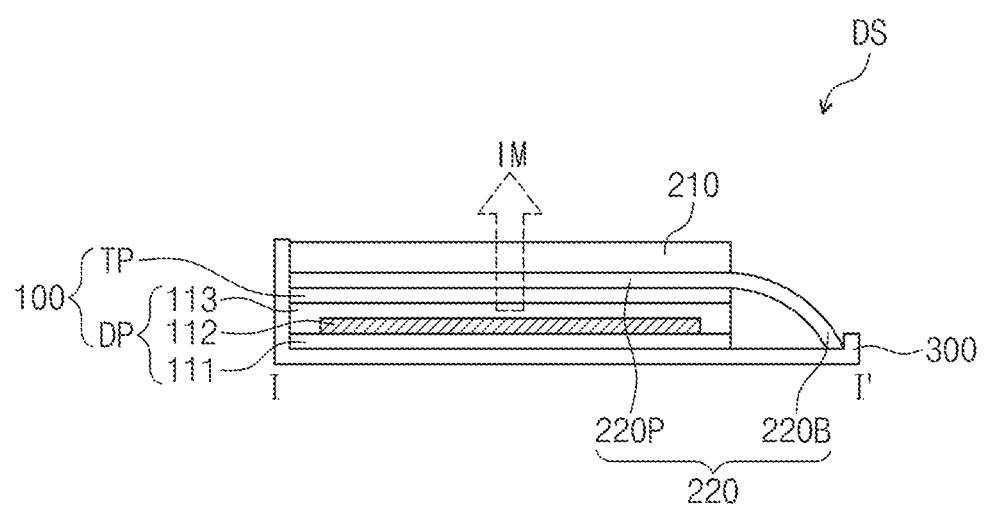
FIG. 2B is a cross-sectional view of the display device of FIG. 2A taken along the line I-I' of FIG. 2A.

FIG. 1 is an exploded perspective view of a display device according to one or more exemplary embodiments of the present inventive concept. FIG. 2A is a perspective view of the display device of FIG. 1 in a coupled state. FIG. 2B is a cross-sectional view of the display device taken along the line I-I' of FIG. 2A. Hereinafter, a display device is described with reference to FIGS. 1, 2A, and 2B.

A display device DS includes a display (e.g., a display member) 100, a cover member (e.g., a cover) 200, and an accommodation member 300. The display 100 is between (e.g., interposed between) the accommodation member 300 and the cover member 200.

The display 100 receives power to display an image IM (e.g., is configured to receive power to display an image IM). The display 100 includes a display area DA and a peripheral area NDA along a plane.

The display area DA is generally defined at a central portion of the display 100. The image IM is displayed in (or on) the display area DA.

The peripheral area NDA is defined adjacent to the display area DA. The peripheral area NDA may be defined as a frame shape surrounding the display area DA. The image IM is not displayed on the peripheral area NDA (e.g., the peripheral area NDA is not configured to display the image IM).

The display 100 may include a display panel DP and a touch panel TP. The display panel DP generates an image according to an electrical signal. The display panel DP is not specifically limited. For example, the display panel DP may include an organic light emitting display panel, a liquid crystal display panel, a plasma display panel, an electrophoretic display panel, and/or an electrowetting display panel.

As illustrated in FIG. 2B, the display panel DP may include a base layer 111, a pixel layer 112, and an encapsulation layer 113.

The base layer 111 may be formed of an insulation material. For example, the base layer 111 may be formed of glass and/or plastic. However, the present inventive concept is not limited thereto.

The pixel layer 112 is disposed on the base layer 111. The pixel layer 112 includes a plurality of pixels. Each of the pixels may include at least one thin film transistor and display element.

The display element may be an organic light emitting element, a liquid crystal capacitor, an electrophoretic element, and/or a conductive ink. For convenience of description, an organic light emitting display panel including the organic light emitting element is described herein as an example of the display panel DP.

The pixels generate light according to an electrical signal to provide an image. Thus, an area on which the pixel layer 112 is disposed may correspond to the display area DA for displaying an image.

The encapsulation layer 113 is disposed on the base layer 111 and covers the pixel layer 112. The encapsulation layer 113 seals the pixel layer 112 and protects the pixel layer 112 from the outside.

The encapsulation layer 113 may be formed of a transparent material so that the light generated from the pixel layer 112 is visible from the outside. The encapsulation layer 113 may have a stacked structure in which a plurality of organic layers and/or inorganic layers are stacked. Thus, the display panel 100 may be reduced in thickness.

Alternatively, the encapsulation layer 113 may be a glass substrate and/or a plastic substrate. Thus, the encapsulation layer 113 may increase in rigidity to improve reliability of the display panel DP. The display panel DP may further include a sealing member (e.g., a predetermined sealing member) for coupling the encapsulation layer 113 to the base layer 111.

The touch panel TP calculates coordinate information of an external input. The external input may include an input using a stylus pen and/or a user's finger, for example. The external input may be substantially generated on the cover member 200.

The touch panel TP may be on (e.g., directly disposed on) the encapsulation layer 113. For example, the touch panel TP may be formed by directly depositing a plurality of touch patterns on the encapsulation layer 113. Alternatively, the touch panel TP may be separately provided and then attached to (or on) the encapsulation layer 113.

The touch panel TP may be integrated with the display panel DP. For example, the touch panel TP may be disposed in the display panel DP. However, the present inventive concept is not limited thereto. For example, the touch panel TP may have various suitable shapes.

Also, a driving method of the touch panel TP is not limited to a specific embodiment. For example, a resistive touch panel or capacitive touch panel may be applied to the touch panel TP. In some embodiments, the touch panel TP may be omitted.

The cover member 200 is disposed on the display 100 to cover the display 100. The cover member 200 may be a window (e.g., a window member) of the display device DS. The cover member 200 includes a rigid member 210 and a flexible member 220.

The rigid member 210 overlaps the display 100. The rigid member 210 defines a plane (e.g., a predetermined flat or substantially flat plane). The plane defined by the rigid member 210 is parallel to or substantially parallel to the display area DA.

The rigid member 210 overlaps at least the display area DA to transmit the image IM displayed on the display area DA. A user may see the image IM through the rigid member 210. When the rigid member 210 has high light transmittance, the display device DS may have improved visibility.

The rigid member 210 may be formed of a material having relatively high rigidity as compared to that of the flexible member 220. For example, the rigid member 210 may be formed of glass.

The flexible member 220 is coupled to a surface of the rigid member 210. The flexible member 220 may be divided into a plurality of parts, including a front part 220P and at least one side part 220B.

The front part 220P defines a front plane. The front plane may be a front plane of the display device DS. Users can see the image IM which the display member 100 displays through the front plane.

The front part 220P overlaps at least the rigid member 210. The front part 220P is coupled to the rigid member 210 and has a shape that corresponds to that of the rigid member 210.

The front plane is parallel to the plane defined by the rigid member 210. Thus, the front plane may include a flat surface. The front part 220P may define a plane that is parallel (or substantially parallel) to the display area DA.

The front part 220P transmits the image IM therethrough. Thus, the front part 220P may be formed of a material having high transmittance. The image IM may be transmitted through the front part 220P that is parallel to the display area DA and the rigid member 210 to be seen by (or made visible to) the user without distortion.

The display area DA may be substantially protected by the front part 220P and the rigid member 210. The cover member 200 according to one or more exemplary embodiments of the present inventive concept may have a stacked structure of the front part 220P and the rigid member 210 on the display area DA to protect (e.g., to stably protect) the display 100 against an external impact applied to the display area DA.

The side part 220B is connected to a side of the front part 220P. The side part 220B may define a side plane different from the front plane. The side plane may be one side plane of the display device DS.

The side part 220B is bent from the front part 220P in a direction (e.g., a first direction). In the present embodiment, the side part 220B is bent downwardly at an angle (e.g., at a predetermined angle) from the front part 220P. The side plane may include only a flat surface, only a curved surface, or surfaces combining a flat surface and a curved surface.

The rigid member 210 partially overlaps the flexible member 220. The side part 220B may not overlap with the rigid member 220. When the rigid member 220 is disposed on the flexible member 210, the side part 220B may be exposed from the rigid member 220 and thus may be visible from the outside.

The flexible member 220 may be formed of a material that is more easily molded relative to the rigid member 210. Thus, the flexible member 220 may be relatively easily deformed in shape when compared to the rigid member 210 and also have relatively low resistibility with respect to the deformation.

The flexible member 220 may be formed of a material that is transparent and has high ductility. For example, the flexible member 220 may include a polymer. The flexible member 220 may be a transparent plastic substrate.

In more detail, the flexible member 220 may include polymethylmethacrylate (PMMA), polycarbonate (PC), methyl-methacrylate-styrene (MS), polystyrene (PS), silicone resin, and/or urethane resin.

The flexible member 220 may further include an adhesive material. For example, the flexible member 220 may include an optical clear adhesive (OCA), a pressure sensitive adhesive (PSA), and/or an optical clear resin (OCR).

The display device DS may further include an adhesive member between the flexible member 220 and the rigid member 210. In this case, the adhesive member may increase cohesive between the flexible member 220 and the rigid member 210.

When the display device DS includes a flat display 100, the side part 220B may extend to the outside of the display 100 to protect a side surface of the display 100. For example, the side part 220B may be attached (e.g., closely attached) to the side surface of the display 100 or spaced (e.g., spaced a predetermined distance) from the display 100 according to the bent angle of the side part 220B.

The accommodation member 300 is disposed under the display 100. The accommodation member 300 defines an inner space (e.g., a predetermined inner space). The display 100 and various components required for driving the display device DS may be stably accommodated in the inner space defined by the accommodation member 300.

The accommodation member 300 is coupled to the cover member 200 to define an outer appearance of the display device DS. For example, the accommodation member 300 may have various suitable shapes such that the accommodation member 300 defines the inner space and is coupled to the cover member 200. However, the present inventive concept is not limited thereto. The accommodation member 300 and the cover member 200 may protect (e.g., may stably protect) the accommodated components against external impact.

According to one or more exemplary embodiments of the present inventive concept, the cover member 200 may have a stacked structure in which the flat rigid member 210 and the flexible member 220 are stacked. The display area DA is protected by the rigid member 210 having relatively high rigidity. Thus, the display device DS may be improved in durability.

Also, the flexible member 220 having relatively high flexibility may be bent at an angle (e.g., may be bent at a predetermined angle) to provide an edge type display device DS. Because the flexible member 220 is formed of a material having superior moldability, stress due to bending may be reduced, and resistance to deformation may be relatively low.

Thus, the cover member 200 may be stably maintained in a bent shape. The cover member 200 according to one or more exemplary embodiments of the present inventive concept may improve reliability and appearance of the display device DS.

Figure 3:
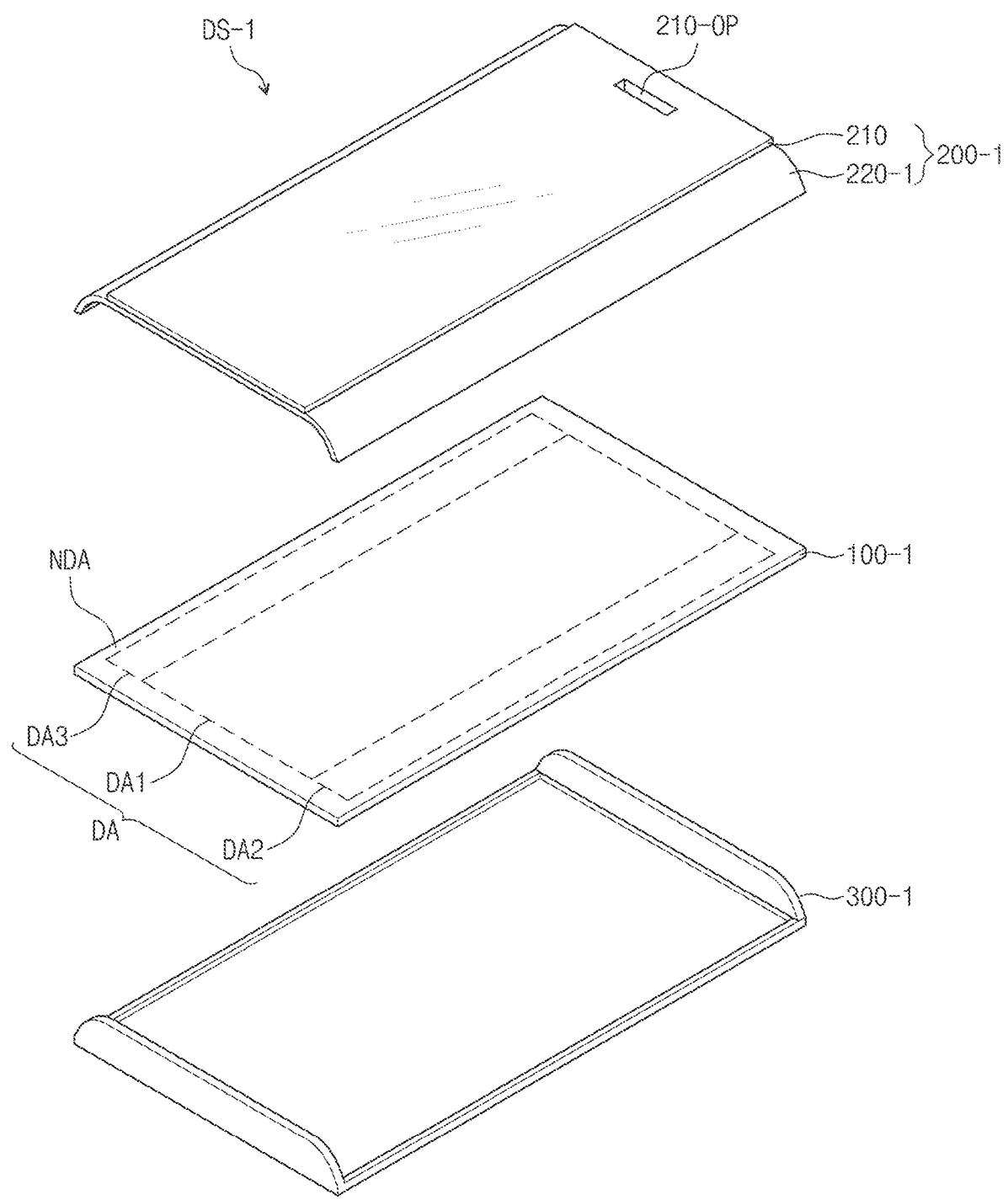
FIG. 3 is an exploded perspective view of a display device according to one or more exemplary embodiments of the present inventive concept.
Figure 4A:
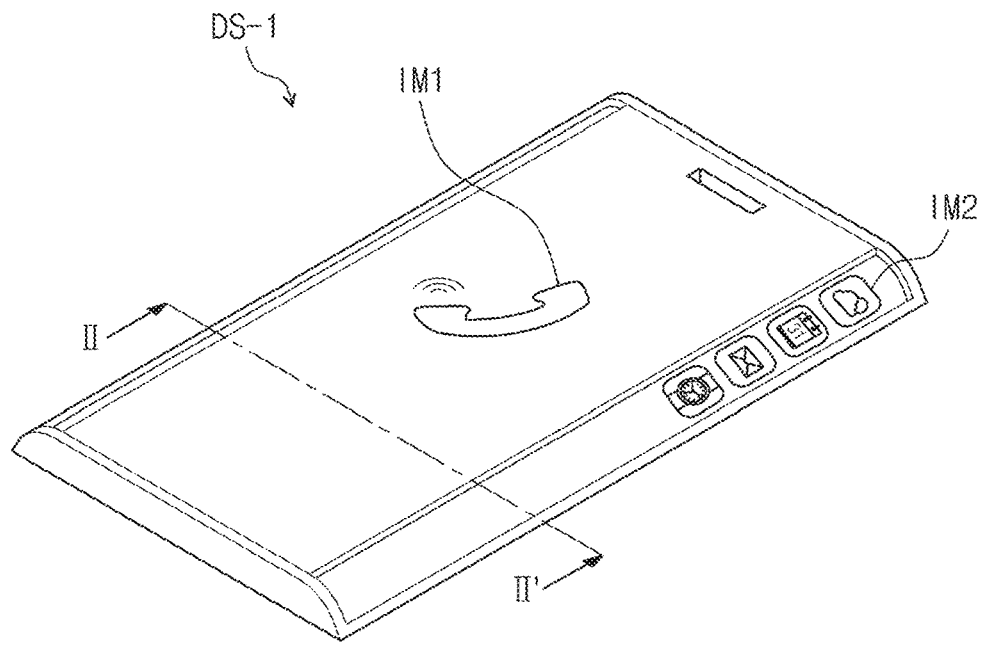
FIG. 4A is a perspective view of the display device of FIG. 3 in a coupled state.
Figure 4B:
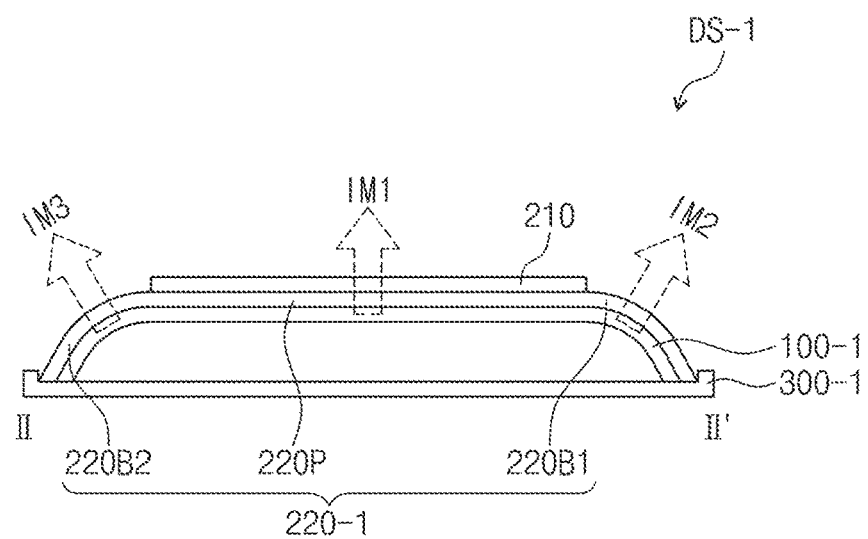
FIG. 4B is a cross-sectional view of the display device of FIG. 4B taken along the line II-II' of FIG. 4A.

FIG. 3 is an exploded perspective view of a display device according to one or more exemplary embodiments of the present inventive concept. FIG. 4A is a perspective view illustrating the display device of FIG. 3 in a coupled state. FIG. 4B is a cross-sectional view of the display device of FIG. 4A taken along the line II-II' of FIG. 4A.

Hereinafter, a display device DS-1 is described with reference to FIGS. 3, 4A, and 4B. The same reference numeral may be given to components that are the same as those of FIGS. 1, 2A, and 2B, and additional description thereof may be omitted.

The display 100-1 may include (or be divided into) a plurality of display areas DA1, DA2, and DA3 and a peripheral area NDA. The display areas DA1, DA2, and DA3 include a first display area DA1, a second display area DA2, and a third display area DA3. Each of the display areas DA1, DA2, and DA3 may display an image (e.g., may be configured to display an image).

The display 100-1 may include a plurality of display parts. The plurality of the display parts may be defined as a plurality of portions corresponding to the display areas DA1, DA2, and DA3.

The first display area DA1 displays a first image IM1. The second display area DA2 is adjacent to a side (e.g., a first side) of the first display area DA1. The second display area DA2 displays a second image IM2. The second image IM2 may be an image that is associated with the first image IM1 or an image that is independent from the first image IM1.

The third display area DA3 is adjacent to a side (e.g., a second side) of the first display area DA1. The third display area DA3 is spaced apart from the second display area DA2 with the first display area DA1 therebetween.

The third display area DA3 displays a third image IM3. The third image IM3 may be an image that is associated with the first and second images IM1 and IM2 or an image that is independent from the first and/or second images IM1 and IM2.

The display 100-1 according to one or more exemplary embodiments of the present inventive concept may be flexible to be bendable (or bent). At least a portion of the display 100-1 may be fixed in a bent state.

Thus, the display areas DA1, DA2, and DA3 may respectively display the first to third images IM1, IM2, and IM3 in directions that are different from each other. For example, the display area DA1 may display the first image IM1 in a first direction, the display area DA2 may display the second image IM2 in a second direction, and the display area DA3 may display the third image IM3 in a third direction. The user may see the first to third images IM1, IM2, and IM3 in the directions that are different from each other.

The display areas DA1, DA2, and DA3 may display images that are different from each other. For example, the first image IM1 may denote (or correspond to) main information, and the second and third images IM2 and IM3 may denote (or correspond to) sub-information.

Alternatively, the display areas DA1, DA2, and DA3 may display one associated image. For example, the first to third images IM1, IM2, and IM3 may be portions that constitute integrated information. Alternatively, the first to third images IM1, IM2, and IM3 may denote (or display) the same information.

A cover (e.g., a cover member) 200-1 may include a flexible member 220-1 including a front part 220P and a plurality of side parts connected to the front part 220P. The side parts include a first side part 220B1 and a second side part 220B2 that are spaced apart from each other.

The first side part 220B1 is connected to a side of the front part 220P. The first side part 220B1 is bent downwardly from the front part 220P.

The first side part 220B1 defines a first plane different from the front plane. The first plane may be parallel to the plane in which the second display area DA2 is defined. The first side part 220B1 covers the first display area DA1 and corresponds to the first display area DA1.

The second side part 220B2 is connected to a side of the front part 220P and is bent downwardly from the front part 220P. The second side part 220B2 defines a second plane different from the front plane. The second plane may be parallel to the plane in which the third display area DA3 is defined.

The second side part 220B2 is spaced apart from the first side part 220B1 with the front part 220P therebetween. The second side part 220B2 covers the second display area DA2 and corresponds to the second display area DA2.

The cover member 200-1 may have a bent shape that corresponds to the bent display panel 100-1. For example, the rigid member 210 that is relatively rigid covers the first display area DA, which is flat, and the flexible member 220-1 that is relatively flexible covers the first display area DA1 and the second and third display areas DA2 and DA3, which are bent.

An accommodation member 300-1 is coupled to the cover member 200-1 to define a shape of the display device DS-1. In the present exemplary embodiment, the accommodation member 300-1 is coupled to the cover member 200-1 so that the first to third images IM1, IM2, and IM3 may be seen from the outside. The accommodation member 300-1 may have various suitable shapes such that the accommodation member 300-1 is coupled to the cover member 200-1 to accommodate the display panel 100-1. However, the present inventive concept is not limited to the above-described shapes.

The display device DS-1 according to one or more exemplary embodiments of the present inventive concept may have a bent shape such that the images are displayed in directions that are different from each other. Because the cover member 200-1 includes the rigid member 210 and the flexible member 220-1, the cover member 200-1 may stably accommodate the display panel while being bent. The cover member 200-1 may provide various shapes of the display device DS-1 without stress due to bending through the flexibility of the flexible member 220-1 while maintaining the rigidity of the rigid member 210.

FIGS. 5A to 5D are cross-sectional views illustrating various shapes of the cover according to one or more exemplary embodiments of the present inventive concept. FIGS. 5A to 5D illustrate an example of the cover member 200-1 of FIG. 3.

As illustrated in FIGS. 5A to 5D, the cover member 200-1 may have various shapes according to the shapes of the flexible member 220-1. The rigid member 210 that is relatively rigid may be fixed to the flat shape.

On the other hand, the flexible member 220-1 may be relatively easily bent as compared to the rigid member 210. The cover member 200-1 may vary in shape according to an angle between ones of the side parts 220B1 and 220B2 and the front part 220P. The angle between the ones of the side parts 220B1 and 220B2 and the front part 220P may be defined as an angle between respective ends of the plurality of side parts 220B1 and 220B2 and the front part 220P.

For example, the first side part 220B1 may include a plane part defining the first plane and a connection part connecting the plane part and the front part 320P.

In this case, the first side part 220B1 may include only a curved surface corresponding to the connection part, may include only a flat surface, or may include a plane combining flat surface and a curved surface. Also, the above description of the first side part 220B1 may be applied to the second side part 220B2 as well as the first side part 220B1.

Figure 5A:
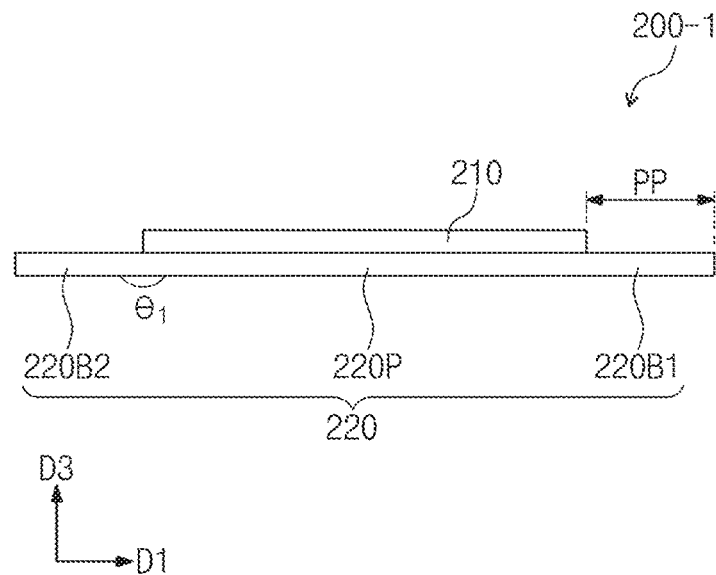
FIGS. 5A-5D are cross-sectional views illustrating various shapes of a cover member according to one or more exemplary embodiments of the present inventive concept.

As illustrated in FIG. 5A, each of the first and second side parts 220B1 and 220B2 may be angled at a first angle θ1 that is substantially 180 degrees with respect to the front part 220P. As such, each of the first and second side parts 220B1 and 220B2 may each have only a flat part PP so as to define only one flat plane.

Each side plane defined by each of the first and second side parts 220B1 and 220B2 may be divided into a connection part BP corresponding to a curved region and the flat part PP corresponding to a flat plane because each of the first and second side parts 220B1 and 220B2 is bent from the front part 220P. The flat part PP may define a flat plane crossing the front part 220P.

Figure 5B:
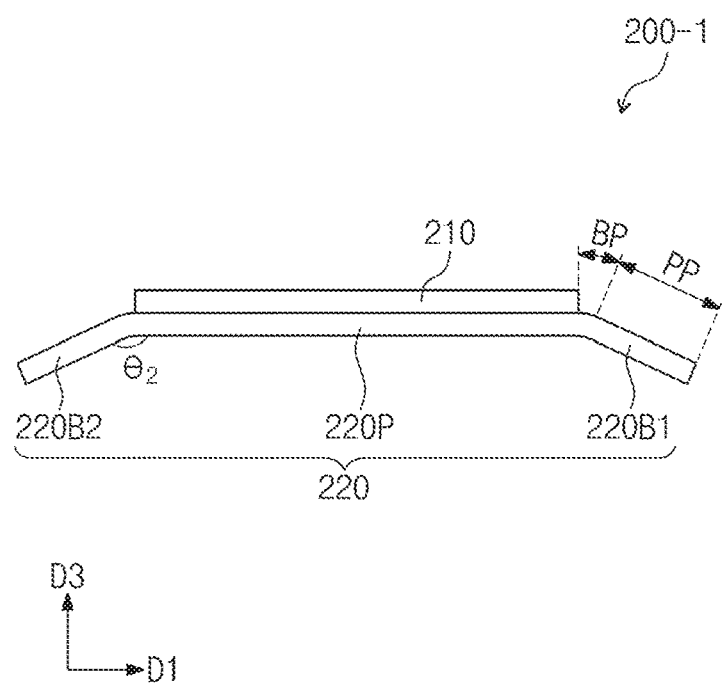
Figure 5C:
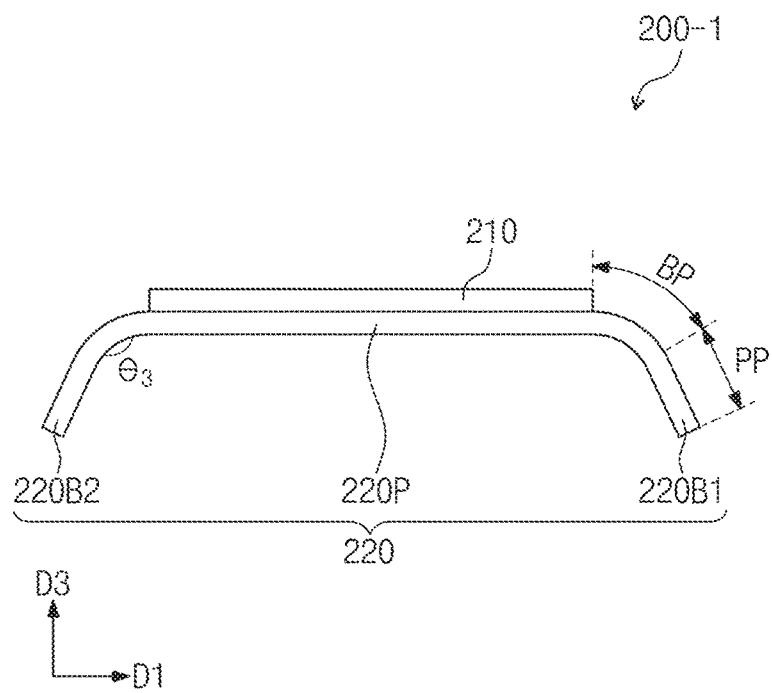

As illustrated in FIGS. 5B and 5C, respectively, the first and second side parts 220B1 and 220B2 may define a second angle θ2 and a third angle θ3 which are both smaller than the first angle θ1. The second angle θ2 is greater than the third angle θ3.

Because the first and second side parts 220B1 and 220B2 are both bent at the second angle θ2 and/or the third angle θ3, the curved surface defined by the cover member 200-1 may gradually decrease in area. Thus, the connection part BP of the first and second side parts 220B1 and 220B2 may increase in area, and the curved surface defined by the connection part BP may increase in curvature.

Figure 5D:
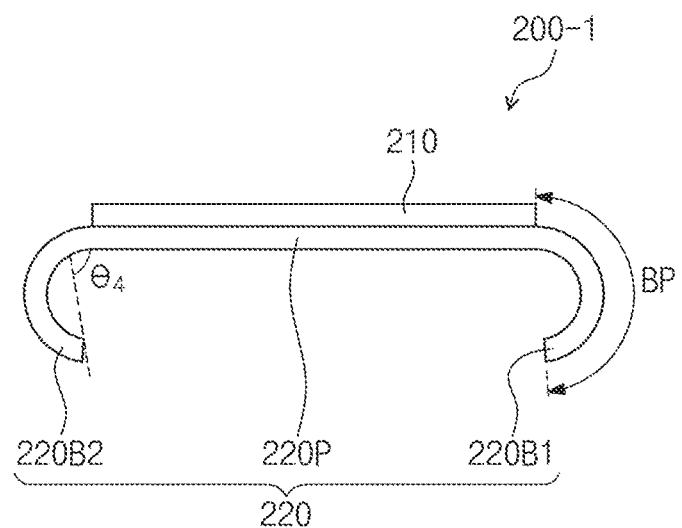

As illustrated in FIG. 5D, each of the first and second side parts 220B1 and 220B2 may be bent at a fourth angle θ4 that is substantially an acute angle. As such, the side surface of the cover member 200-1 may define the curved surface without defining the plane.

Thus, the first and second side parts 220B1 and 220B2 may have only curved surfaces. The cover member 200-1 may have a side surface having a substantially semicircular shape.

The cover member 200-1 according to one or more exemplary embodiments of the present inventive concept may provide the display device having various shapes by changing the shape of the flexible member 220-1. The flexible member 220-1 may be easily deformed and may have low resistance to deformation. Thus, the bent shape of the flexible member 220-1 may be stably maintained.

The cover according to one or more exemplary embodiments of the present inventive concept may have a curved shape, to which bending stress is applied, by including the flexible member, and a planar shape by including the rigid member, which is relatively rigid. Thus, the cover may have rigidity and flexibility.

The cover may have a shape that corresponds to that of the display for displaying an image in various directions to easily cover the display areas on which images are displayed. Thus, the display device may be improved in reliability without being limited to the shape thereof.

Figure 6:
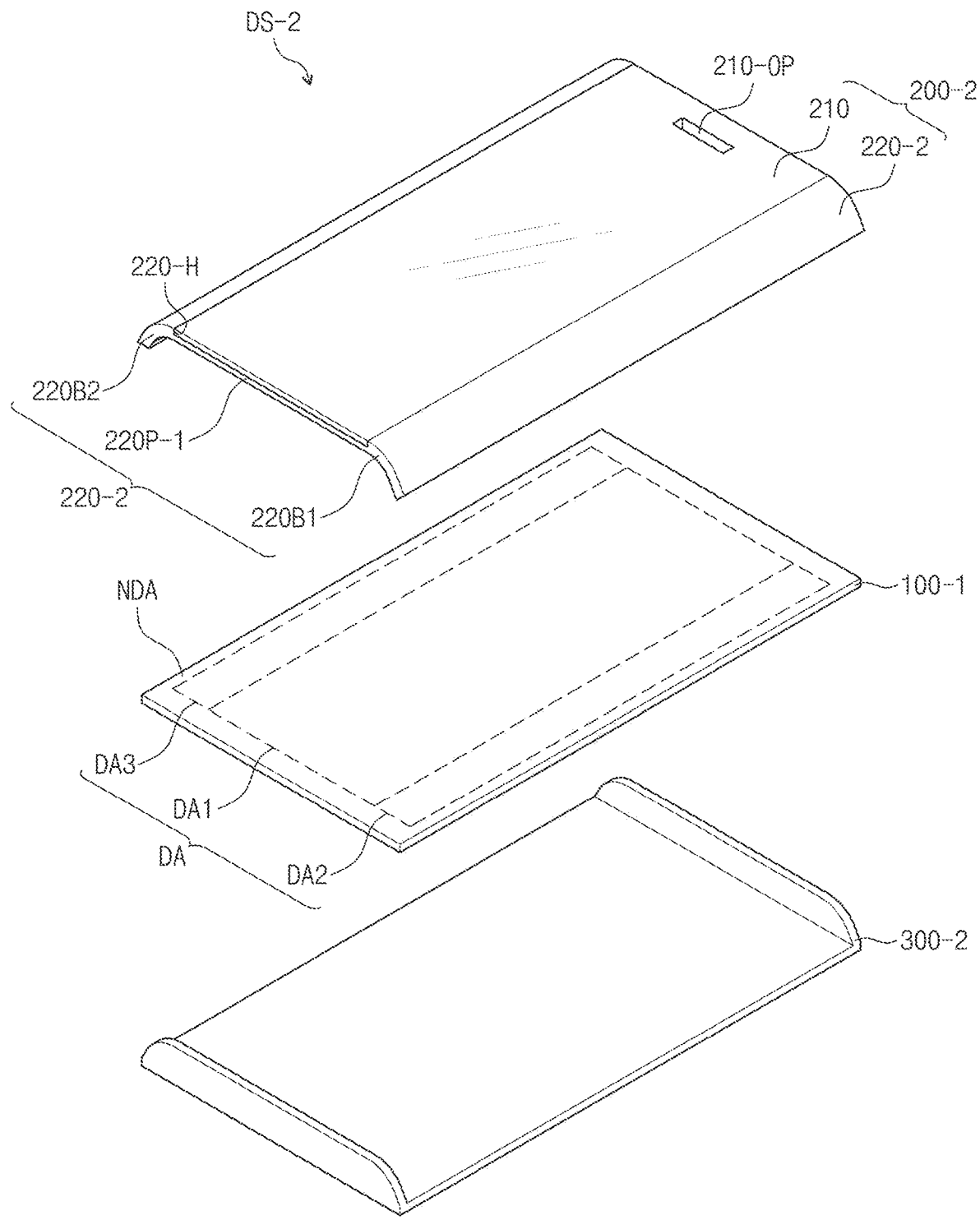
FIG. 6 is an exploded perspective view of a display device according to one or more exemplary embodiments of the present inventive concept.
Figure 7A:
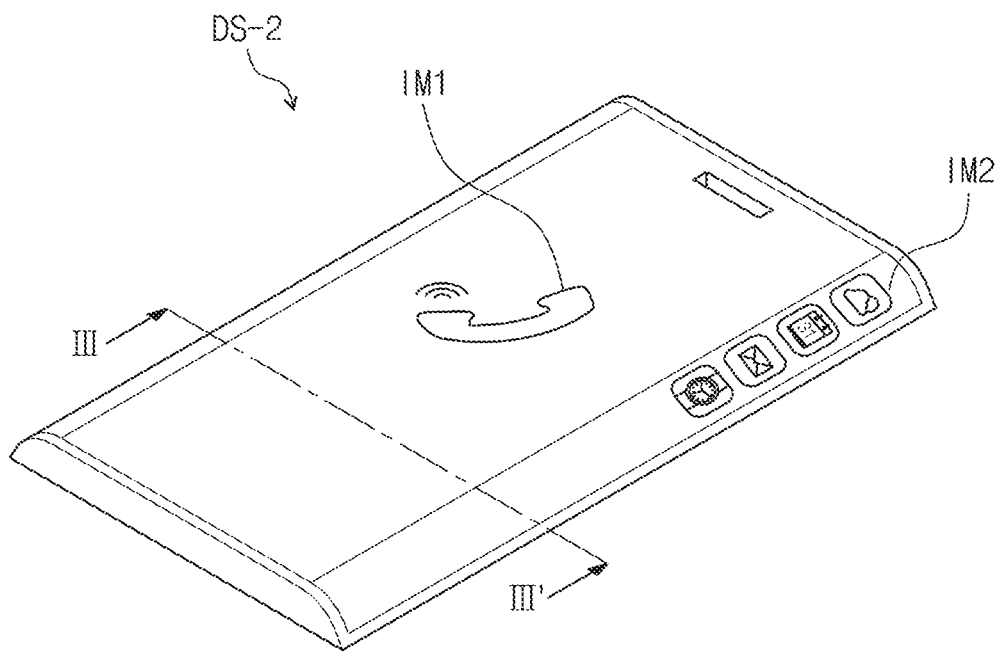
FIG. 7A is a perspective view of the display device of FIG. 6 in a coupled state.
Figure 7B:
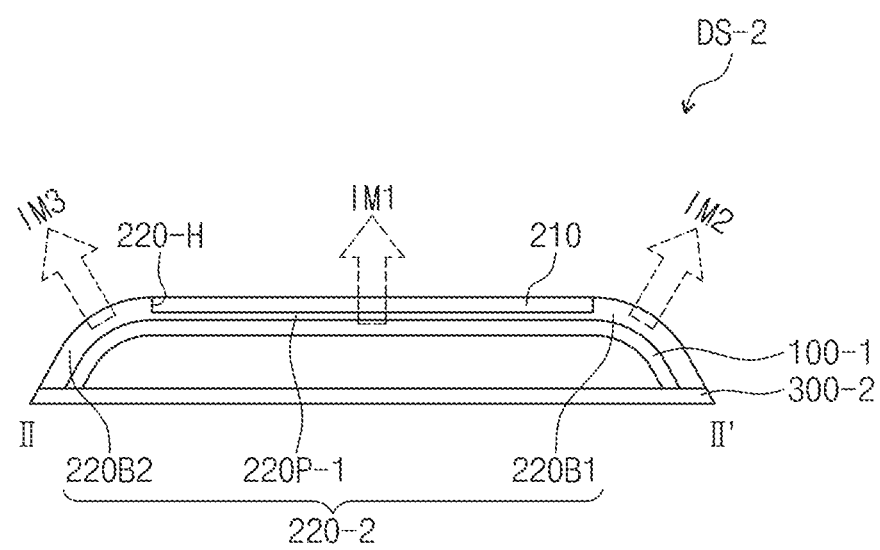
FIG. 7B is a cross-sectional view of the display device of FIG. 7A taken along the line III-III' of FIG. 7A.

FIG. 6 is an exploded perspective view of a display device according to one or more exemplary embodiments of the present inventive concept. FIG. 7A is a perspective view illustrating the display device of FIG. 6 in a coupled state. FIG. 7B is a cross-sectional view of the display device of FIG. 7A taken along the line III-III' of FIG. 7A.

The same reference numerals may be given to components that are the same or substantially the same as those of FIGS. 1 to 5D, and thus additional descriptions thereof may be omitted. Hereinafter, a display device DS-2 is described with reference to FIGS. 6, 7A, and 7B.

A cover member 200-2 includes a rigid member 210 and a flexible member 220-2. At least one recess part 220H may be defined in the flexible member 220-2. The flexible member 220-2 may be substantially the same as the flexible member 220-1 of FIG. 3, with the exception of the recess part 220H. FIGS. 6, 7A, and 7B illustrate an example in which the recess part 220H is defined in a front part 220P-1 of the flexible member 220-2.

The recess part 220H may be defined by removing a portion of the front part 220P-1 in a thickness direction of the flexible member 220-2. The rigid member 210 may be disposed in the recess part 220H.

The recess part 220H may have substantially the same shape as the front part 220P-1. The front part 220P-1 contacts lower and side surfaces of the rigid member 210. Thus, the rigid member 210 may be surrounded by the front part 220P-1.

The cover member 200-2 as a whole (e.g., in its entirety) may have a uniform thickness. For example, each of the side parts 220B1 and 220B2 may have a thickness that is substantially equal to the sum of a thickness of the rigid member 210 and a thickness of the front part 220P-1.

In the cover member 200-2 according to one or more exemplary embodiments of the present inventive concept, the rigid member 210 may be inserted into the flexible member 220-2. Thus, visibility of a boundary between the rigid member 210 and the flexible member 220 may be reduced. As a result, the rigid member 210 and the flexible member 220-2 may be smoothly connected to each other as if the rigid member 210 and the flexible member 220-2 are integrally formed.

Figure 8:
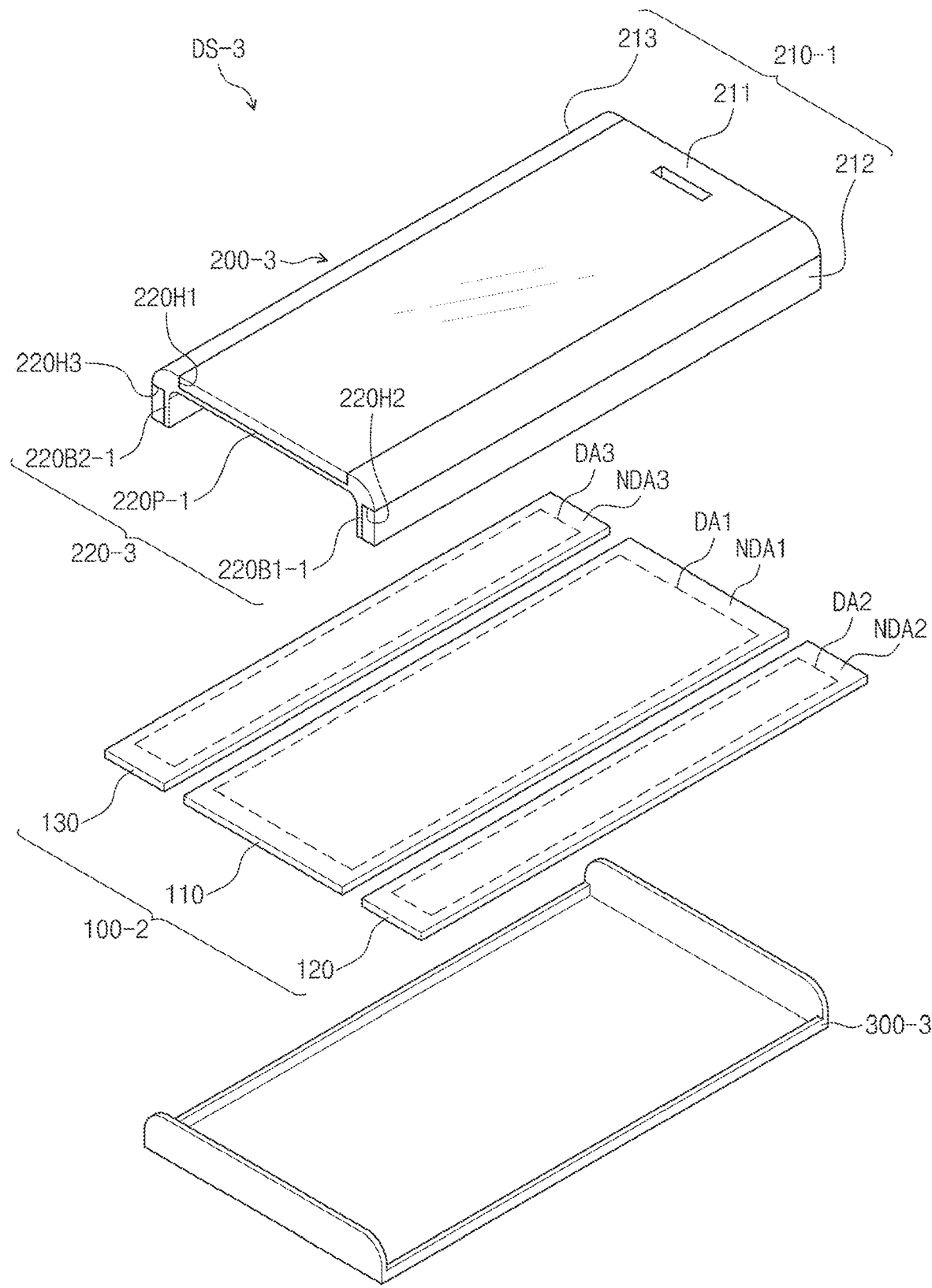
FIG. 8 is an exploded perspective view of a display device according to one or more exemplary embodiments of the present inventive concept.
Figure 9A:
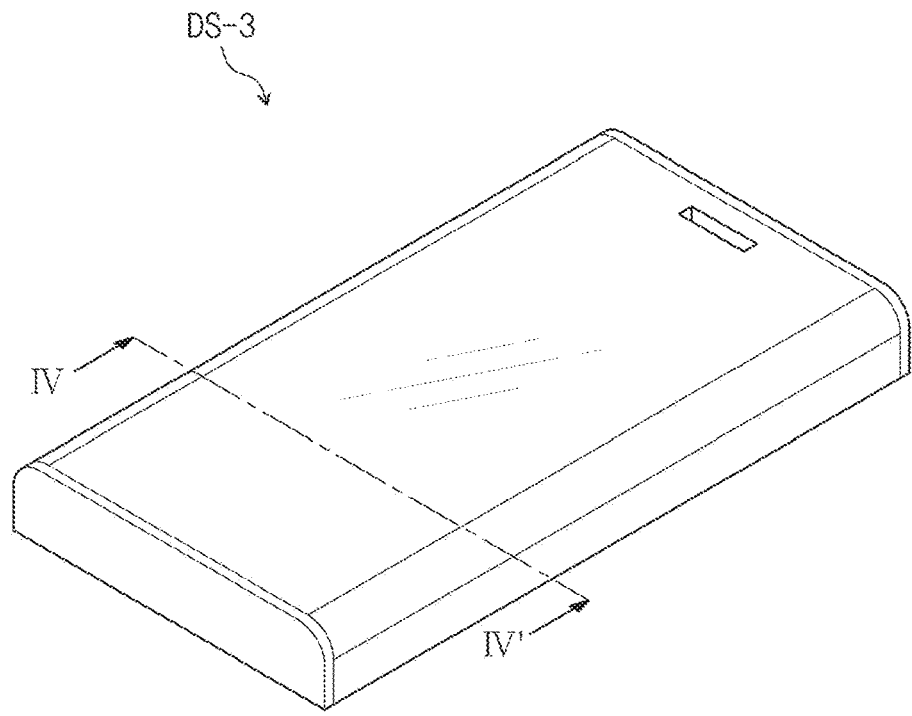
FIG. 9A is a perspective view of the display device of FIG. 8 in a coupled state.
Figure 9B:
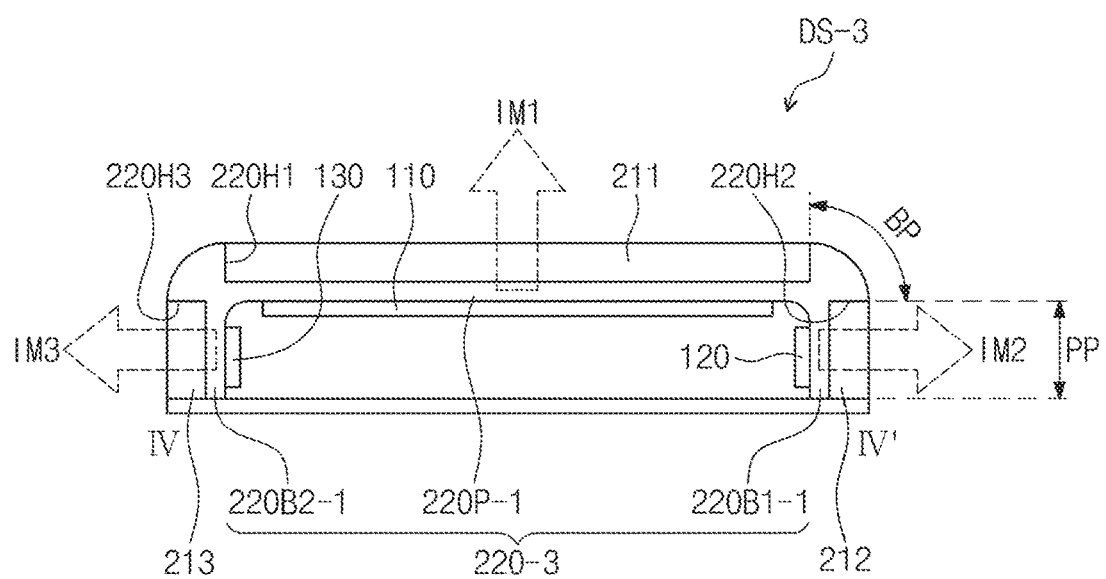
FIG. 9B is a cross-sectional view of the display device of FIG. 9A taken along the line IV-IV' of FIG. 9A.

FIG. 8 is an exploded perspective view of a display device according to one or more exemplary embodiments of the present inventive concept. FIG. 9A is a perspective view of the display device of FIG. 8 in a coupled state. FIG. 9B is a cross-sectional view of the display device of FIG. 9A taken along the line IV-IV' of FIG. 9A.

A display device DS-3 of FIGS. 8, 9A, and 9B may have the same or substantially the same components as the display device DS-1 of FIG. 3, with the exception of a cover member 200-3. Hereinafter, the same reference numeral may be given to components that are the same or substantially the same as those of FIGS. 1 to 7B, and thus additional descriptions thereof may be omitted.

The cover member 200-3 may include a plurality of rigid members 210-1 and a flexible member 220-3 including a plurality of recess parts 220H1, 220H2, and 220H3. The rigid members 210-1 include a first rigid member 211, a second rigid member 212, and a third rigid member 213. The rigid members 211, 212, and 213 are disposed in the recess parts 220H1, 220H2, and 220H3, respectively.

The recess parts 220H1, 220H2, and 220H3 include a first recess part 220H1 defined in a front part 220P-1 of the flexible member 220-3, a second recess part 220H2 defined in a first side part 220B1-1 of the flexible member 220-3, and a third recess part 220H3 defined in a second side part 220B2-1 of the flexible member 220-3.

The first to third recess parts 220H1, 220H2, and 220H3 may be defined in directions that are different from each other. Thus, the rigid members 210-1 may be disposed in directions that are different from each other.

The front part 220P-1 may be formed by recessing at least a portion of the front part 220P of FIG. 3 in a thickness direction of the plane part 200P to define the first recess part 200H1. The first recess part 220H1 is defined parallel to the first display area DA1.

Thus, the first rigid member 211 may be disposed to face an upper side of the display device DS-3, thereby defining a front surface of the display device DS-3. The user may see a first image IM1 through the first rigid member 211.

The first side part 220B1-1 may be formed by recessing at least a portion of the first side part 220B1 of FIG. 3 in a thickness direction of the first side part 220B1 to define the second recess part 220H2. Similarly, the second side part 220B2-1 may be formed by recessing at least a portion of the first side part 220B2 of FIG. 3 in a thickness direction of the first side part 220B2 to define the second recess part 220H3.

Thus, the second rigid member 212 and the third flexible member 213 may define opposite side surfaces of the display device DS-3. The user may see a second image IM2 through the second rigid member 212. Also, the user may see a third image IM3 through the third rigid member 213.

In the present embodiment, each of the first and second side parts 220B1-1 and 220B2-1 may include a connection part BP and a flat part PP. The flat part PP may define a first plane or a second plane that overlaps with the second rigid member 212 and the third rigid member 213.

The connection part BP defines a curved surface. The connection part BP connects each of the first and second side parts 220B1-1 and 220B2-1 to the front part 220P-1. The cover 220-3 according to one or more exemplary embodiments of the present inventive concept may include the connection part BP having a curved shape and connecting the plurality of rigid members 211, 212, and 213 defining the bent planes to each other, thereby providing the cover 220-3 having a curved shape.

The display 100-2 may include first to third sub-displays 110, 120, and 130 which are independent from each other. Each of the first to third sub-displays 110, 120, and 130 may be a display panel.

The first sub-display 110 may be divided into a first display area DA1 and a first non-display area NDA1 in a plan view. The first sub-display 110 is disposed to correspond to the front part 220P-1 and the first rigid part 211, and provides a first image IM1 to front of the display device DS-3.

The second sub-display 120 may be divided into a second display area DA2 and a second non-display area NDA2 in a plan view. The second sub-display 120 is disposed to correspond to the first side part 220B1-1 and the second rigid part 212.

The third sub-display 130 may be divided into a third display area DA3 and a third non-display area NDA3 in a plan view. The third sub-display 130 is disposed to correspond to the second side part 220B2-1 and the third rigid part 213.

The second sub-display 120 and the third sub-display 130 are parallel to each other. The second sub-display 120 and the third sub-display 130 respectively provide the second and third images IM2 and IM3 to two sides of the display device DS-3.

The first to third rigid members 211, 212, and 213 may be disposed inside the flexible member 220-3. For example, the recess parts 200H1, 200H2, and 200H3 may be defined inside the flexible member 220-3.

The first to third rigid members 211, 212, and 213 are covered by the flexible member 220-3. An outer surface of the cover member 200-3 may have a uniformly planarized surface by the flexible member 220-3. Thus, boundaries between the first to third rigid members 211, 212, and 213 may not be seen from the outside.

The display device according to one or more exemplary embodiments of the present inventive concept may include the plurality of divided rigid members 211, 212, and 213 to improve rigidity at areas of the cover member 200-3 corresponding to the first to third display areas DA1, DA2, and DA3. According to one or more exemplary embodiments of the present inventive concept, because a portion of the cover member 200-3 corresponding to the display area is formed of the material having high rigidity, and a portion for forming the bent shape is formed of the material having high flexibility, the display device has improved reliability with respect to the various shapes.

Figure 10A:
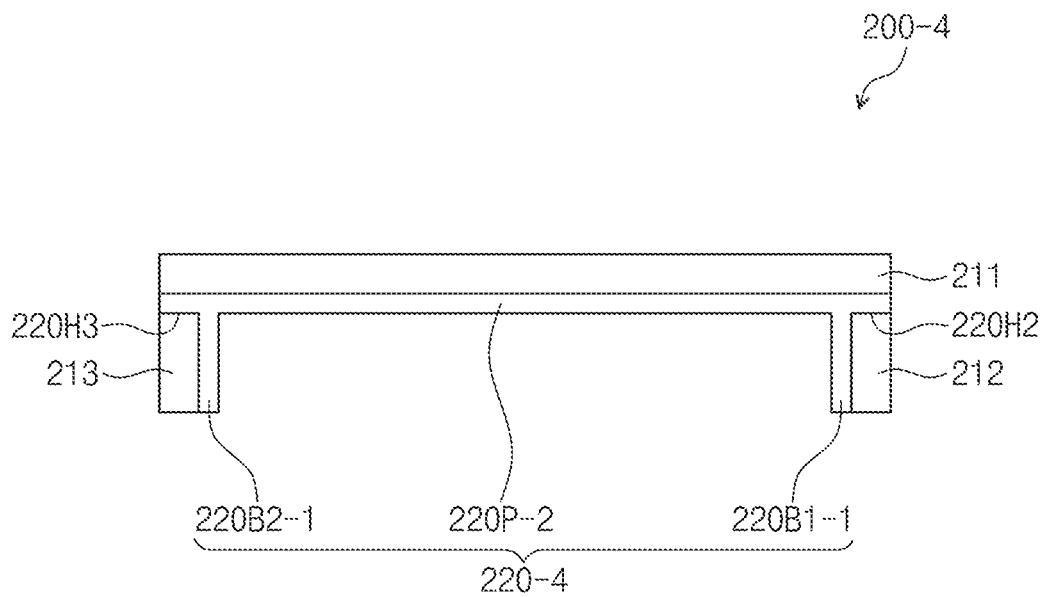
FIGS. 10A-10B are cross-sectional views illustrating a cover member according to one or more exemplary embodiments of the present inventive concept.
Figure 10B:
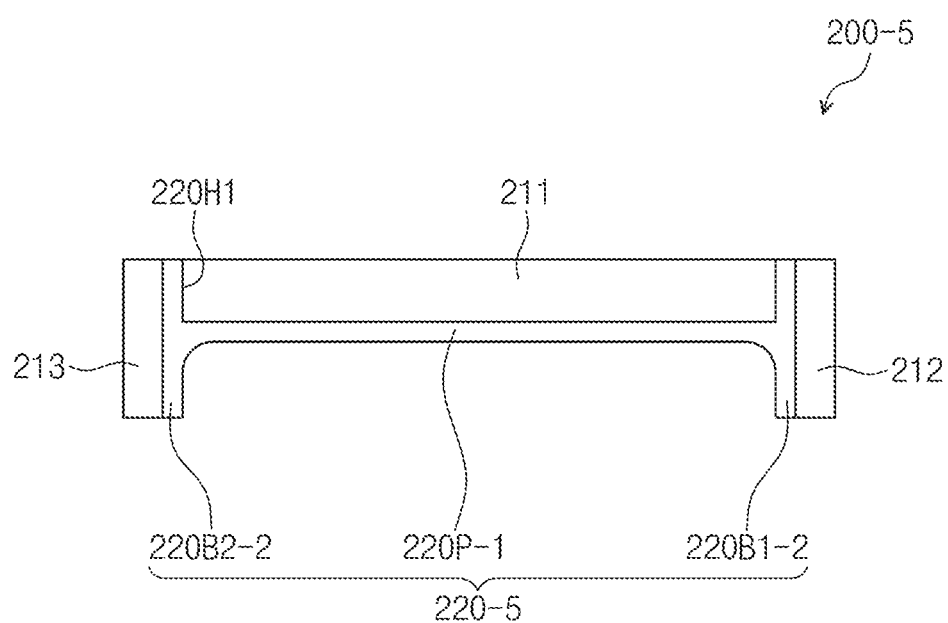

FIGS. 10A and 10B are cross-sectional views illustrating a cover according to one or more exemplary embodiments of the present inventive concept. FIGS. 10A and 10B illustrate an example in which the plurality of rigid members 211, 212, and 213 are provided to correspond to the cover member 200-3 of FIG. 8.

As illustrated in FIG. 10A, the second and third recess parts 220H2 and 220H3 may be defined in a flexible member 220-4. As compared to the flexible member 220-3 of FIG. 8, the first recess part 220H1 may extend up to the first and second side parts 220B1-1 and 220B2-1 to substantially form a front part 220P-2, which does not include the first recess part 220H1.

The first rigid member 211 fully covers the front part 220P-2. The front part 220P-2 may have substantially the same shape as the first rigid member 211 (e.g., a surface of the front part 220P-2 may have substantially the same shape as a surface of the first rigid member 211). The first rigid member 211 may overlap a side surface of the second rigid member 212 and a side surface of the third rigid member 213 along a plane.

The second rigid member 212 and the third rigid member 213 are disposed in the second recess part 220H2 and the third recess part 220H3, respectively. Because this structure corresponds to that of the cover member 200-3 of FIG. 8, additional description thereof may be omitted.

As illustrated in FIG. 10B, the first recess part 220H1 may be defined in the flexible member 220-5. As compared to the flexible member 220-3 of FIG. 8, each of the second and third recess parts 220H2 and 220H3 may extend up to the front part 220P-1 to substantially form a first side part 220B1-2 from which the second recess part 220H2 is removed and a second side part 220B2-2, which does not include the third recess part 220H3.

Each of the second and third rigid members 212 and 213 overlaps a side surface of the first rigid member 211. Each of the second and third rigid members 212 and 213 may be perpendicular to the first rigid member 211.

The first rigid member 211 is disposed in the first recess part 220H1. Because this structure corresponds to that of the cover member 200-3 of FIG. 8, additional description thereof may be omitted.

Referring to FIGS. 10A and 10B, as each of the rigid members increases in area, durability of covers 200-4 and 200-5 may be improved as compared to that of the cover member 200-3 of FIG. 8.

The cover according to one or more exemplary embodiments of the present inventive concept may have a bent shape by using the plurality of divided rigid members. The rigid members may be connected to each other through the flexible member to easily manufacture the cover having the various shapes.

FIGS. 11A to 11E are cross-sectional views illustrating a method of manufacturing the cover according to one or more exemplary embodiments of the present inventive concept. FIGS. 11A to 11E exemplarily illustrate a method of manufacturing the cover member 200-3 of FIG. 8. Hereinafter, a method of manufacturing the cover by utilizing a mold is described with reference to FIG. 11A to 11E.

Figure 11A:
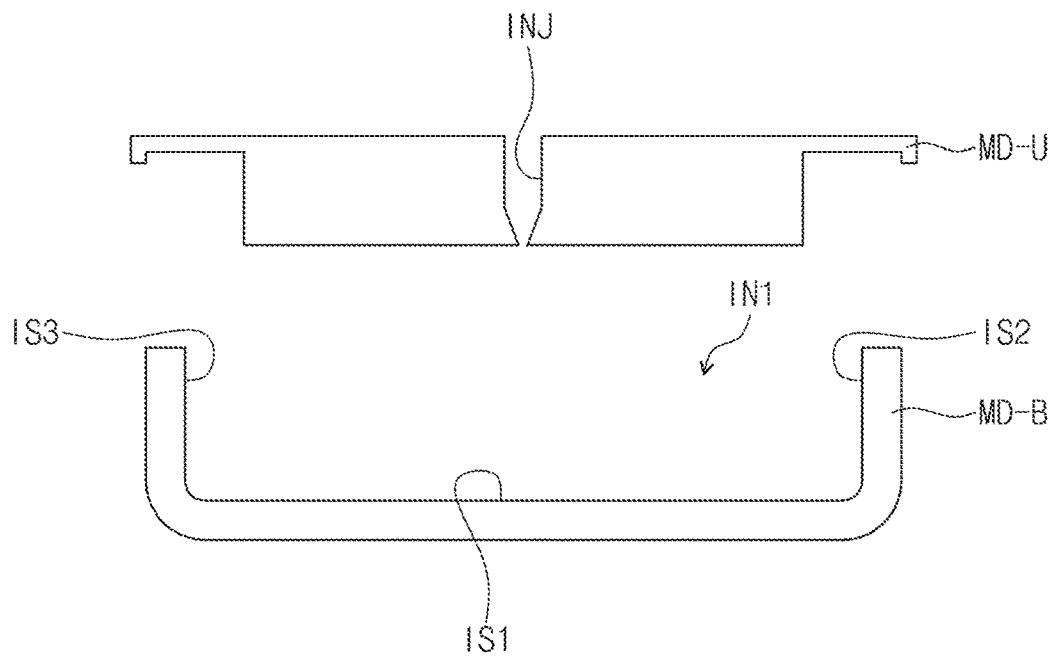
FIGS. 11A-11E are cross-sectional views illustrating a method of manufacturing a cover member according to one or more exemplary embodiments of the present inventive concept.

As illustrated in FIG. 11A, a lower mold MD-B and an upper mold MD-U are provided. The lower mold MD-B includes a planar surface IS1, a plurality of side surfaces bent upward from the plane IS1 around (or surrounding) the planar surface IS1, and outer surfaces connected to the side surfaces.

The planar surface IS1 and the side surfaces define a first inner space IN1 of the lower mold MD-B, and the outer surfaces define an outer appearance of the lower mold MD-B. For convenience of description, a first side surface IS2, a second side surface IS3, and the planar surface IS1 are illustrated in FIGS. 11A to 11E.

The upper mold MD-U may be coupled to the lower mold MD-B. At least one injection part INJ is defined in the upper mold MD-U. The injection part INJ has a side facing the lower mold MD-B and an opposite side facing an upper side of the upper mold MD-U.

Figure 11B:
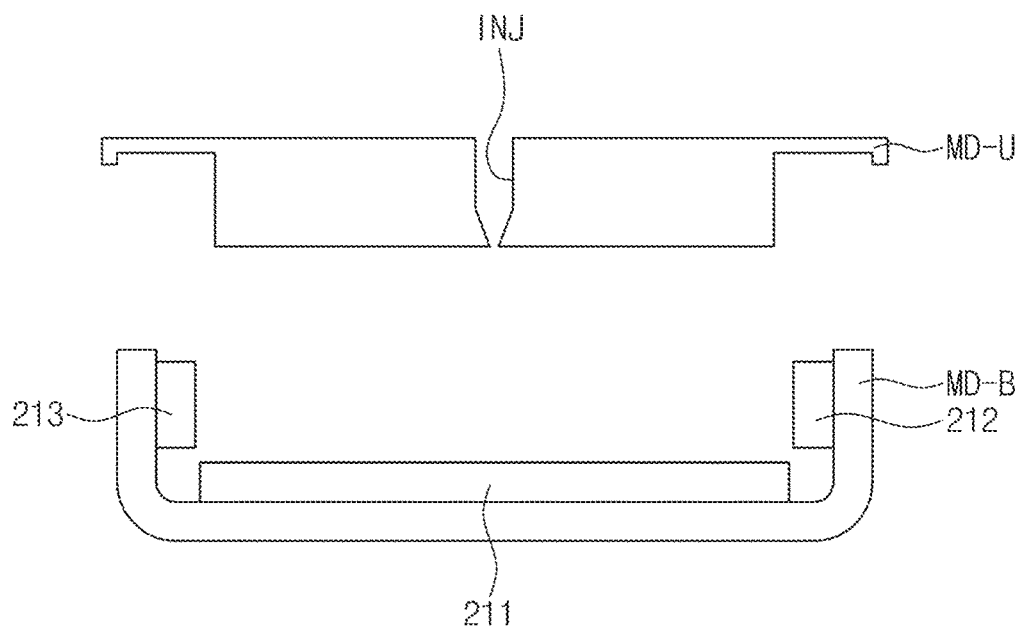

As illustrated in FIG. 11B, first and second rigid members 211, 212, and 213 are disposed in the lower mold MD-B. The first rigid member may be mounted on the planar surface IS1, the second rigid member 212 may be mounted on the first side surface IS2, and the third rigid member 213 may be mounted on the second side surface IS3.

To mount the first to third rigid members 211, 212, and 213 on the lower mold MD-B, an adhesive (e.g., a predetermined adhesive material) may be applied to the planar surface IS1, the first side surface IS2, and the second side surface IS3. For example, the first to third rigid members 211, 212, and 213 may be stably fixed to the lower mold MD-B.

Figure 11C:
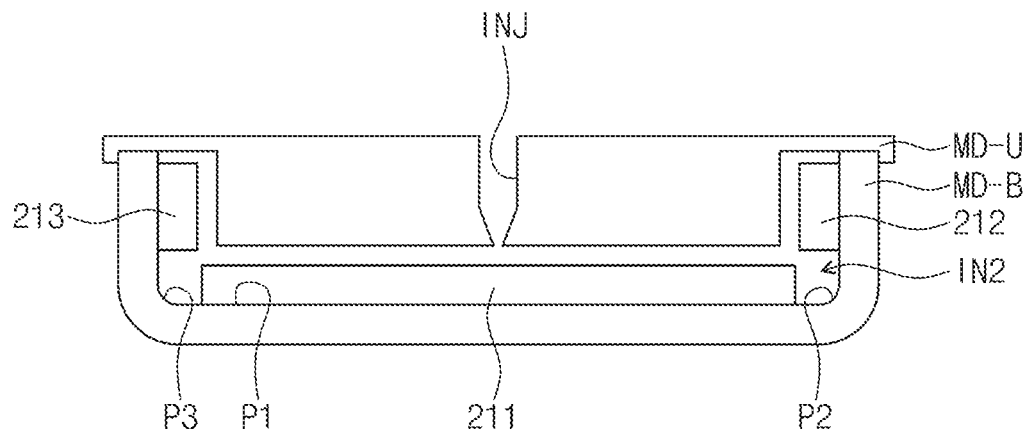

As illustrated in FIG. 11C, the upper mold MD-U and the lower mold MD-B are coupled to each other. The upper mold MD-U and the lower mold MD-B are coupled to each other to define a second inner space IN2.

Figure 11D:
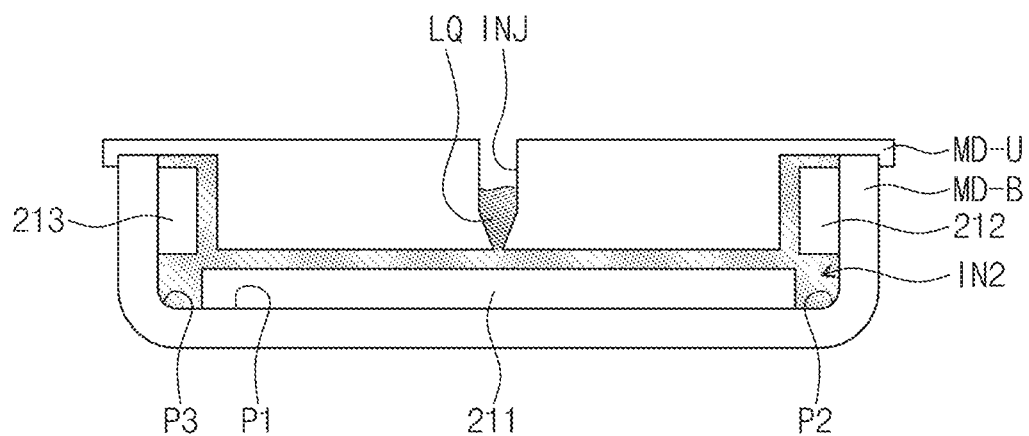

As illustrated in FIG. 11D, a liquid polymer LQ is injected into the second inner space IN2. The liquid polymer LQ may be injected into the second inner space IN2 through the injection part INJ defined in the upper mold MD-U. The liquid polymer LQ is filled into the second inner space IN2.

The filled liquid polymer LQ is cured in the second inner space IN2. The liquid polymer LQ may be cured through heat or light irradiation, or may be cured by being exposed to air, for example.

Figure 11E:
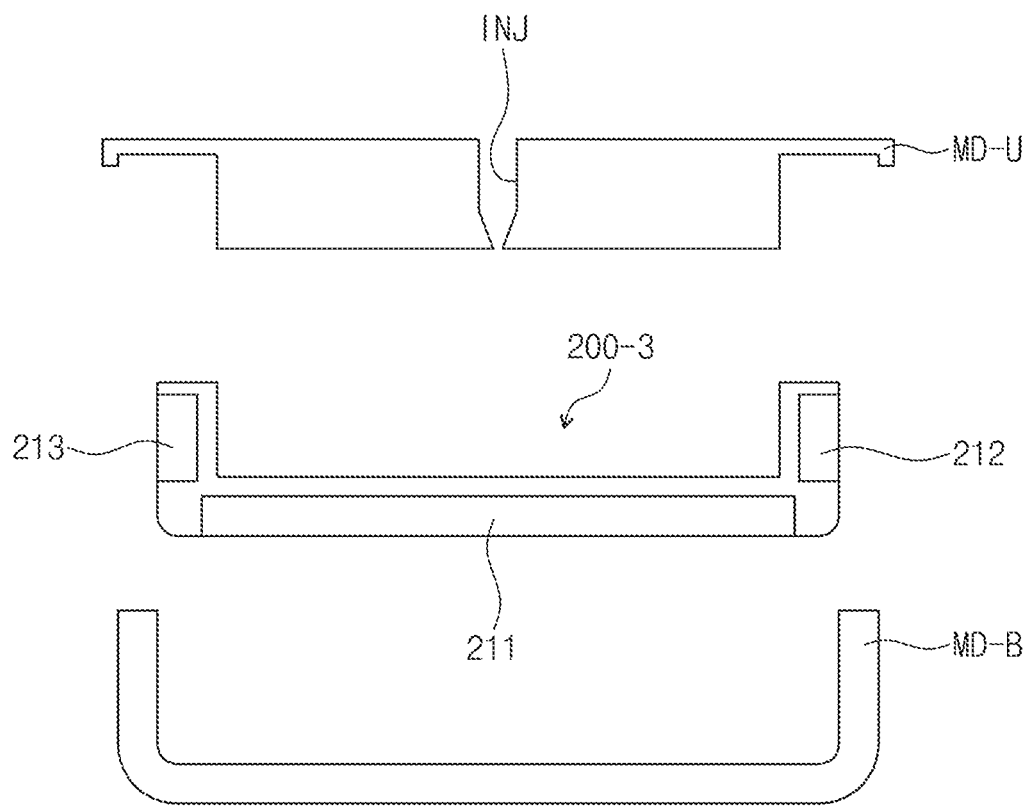

As illustrated in FIG. 11E, the coupling of the upper mold MD-U and the lower mold MD-B is released, and a cover member 200-3 is formed. The cover member 200-3 may include the first to third rigid members 211, 212, and 213 and the cured polymer connecting the first to third rigid members 211, 212, and 213 to each other.

In the method of manufacturing the cover according to one or more exemplary embodiments of the present inventive concept, the cover having a bent shape may be formed without applying stress. The bent shape may be easily provided through the connection of the plurality of rigid members by using the liquid polymer.

Figure 12A:
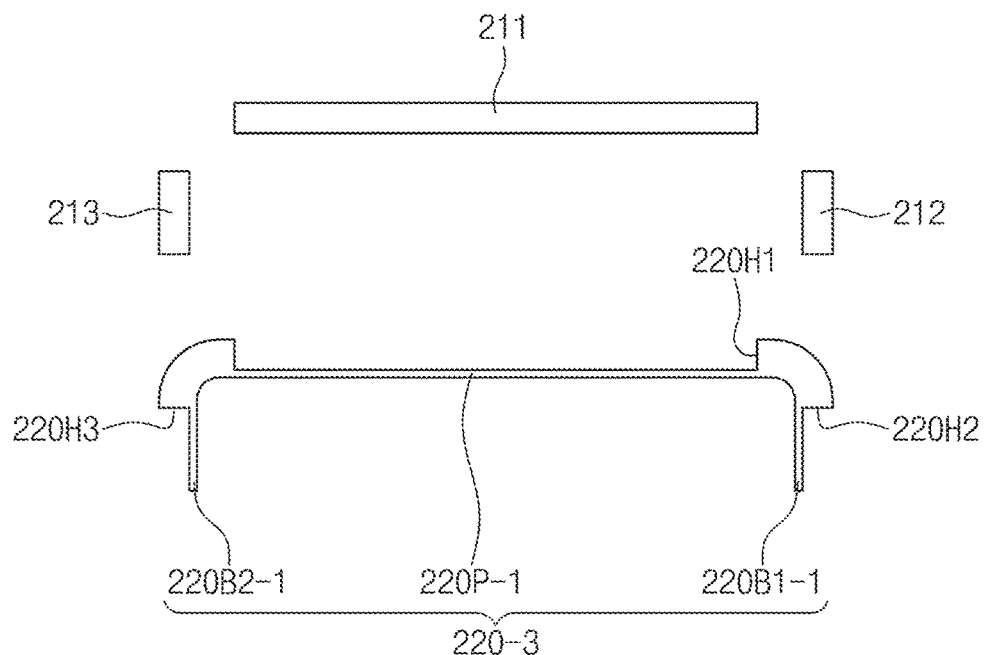
FIGS. 12A-12C are cross-sectional views illustrating a method of manufacturing a cover member according to one or more exemplary embodiments of the present inventive concept.
Figure 12B:
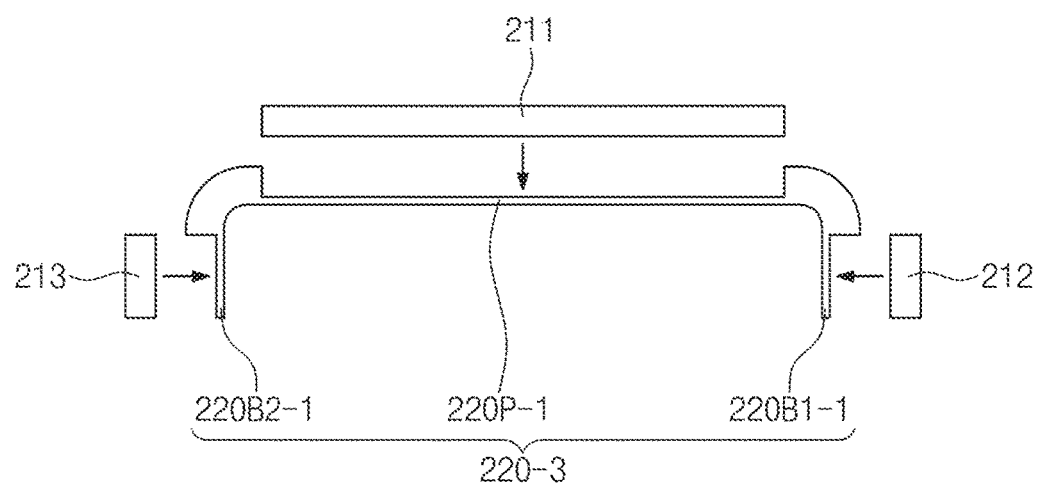
Figure 12C:
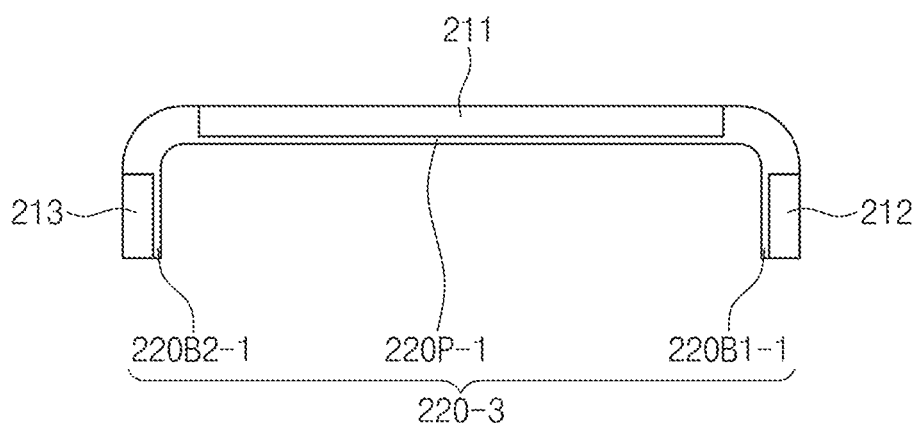

FIGS. 12A to 12C are cross-sectional views illustrating a method of manufacturing the cover according to one or more exemplary embodiments of the present inventive concept. FIGS. 12A to 12C exemplarily illustrate a method of manufacturing the cover member 200-3 of FIG. 8. Hereinafter, a method of manufacturing the cover through assembly is described with reference to FIGS. 12A to 12C.

As illustrated in FIG. 12A, a plurality of rigid members 211, 212, and 213 and a flexible member 220-3 are provided. The flexible member 220-3 includes a front part 220P-1, a first side part 220B1-1, and a second side part 220B2-1.

The first side part 220B1-1 is bent downwardly from one side of the front part 220P-1. The second side part 220B2-1 is bent downwardly from the other side of the front part 220P-1.

A first recess part 220H1 is defined in the front part 220P-1. Similarly, a second recess part 220H2 is defined in the first side part 220B1-1, and a third recess part 220H3 is defined in the second side part 220B2-1.

The flexible member 220-3 is molded through injection molding. The flexible member 200-3 having a somewhat complex shape may be easily molded by injection molding.

As illustrated in FIGS. 12B and 12C, the rigid members 211, 212, and 213 may be coupled to the flexible member 220-3 to form the cover member 200-3. The plurality of rigid members 211, 212, and 213 are coupled to the first to third recess parts 220H1, 220H2, and 220H3, respectively.

In the present embodiment, the first to third recess parts 220H1, 220H2, and 220H3 may have shapes that correspond to those of the rigid members 211, 212, and 213, respectively. Thus, the first to third recess parts 220H1, 220H2, and 220H3 may have depths that are substantially the same as thicknesses of the rigid members 211, 212, and 213, respectively.

In the method of manufacturing the cover according to one or more exemplary embodiments of the present inventive concept, the cover having a bent shape may be provided without applying a bending stress. In addition, the bent portion may include the flexible member that is relatively flexible to reduce resistance with respect to the deformation. Therefore, the cover may be stably maintained in the bent shape to improve reliability thereof.

Therefore, the display device according to one or more embodiments of the present inventive concept may have suitable rigidity for protecting the display area and suitable flexibility so that the cover has various shapes that correspond to those of the display device. Thus, the display device that displays an image in various directions may have improved durability.

Also, in the method of manufacturing the cover according to one or more embodiments of the present inventive concept, the cover having a bent shape may be easily manufactured by using the rigid member having high rigidity and the flexible member having high ductility. Therefore, the cover having various shapes provided without applying stress for bending may be provided.

While this disclosure has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims and their equivalents.

What is claimed is:

1. A method of manufacturing a cover member, the method comprising:
   providing a lower mold defining a first inner space;
   providing a rigid member formed of glass in the first inner space, the rigid member comprising a first rigid member and a second rigid member offset from the first rigid member, the first and second rigid members defining a gap therebetween;
   providing an upper mold on the lower mold to define a second inner space different from the first inner space;
   injecting a liquid polymer into the second inner space including the gap between the first and second rigid members;
   curing the liquid polymer to form the cover member, the cover member being a window of a display device; and
   separating the cover member from the upper and lower molds,
   wherein an upper surface of the rigid member is exposed to the second inner space, and the liquid polymer covers an entirety of the upper surface of the rigid member,
   wherein the first inner space is defined by a planar surface of the lower mold and side surfaces bent from the planar surface in a first direction to surround the planar surface, and
   wherein the first rigid member is on the planar surface and the second rigid member is on one of the side surfaces.

2. The method of claim 1, wherein the rigid member further comprises:
   a third rigid member on one of the side surfaces facing the one of the side surfaces on which the second rigid member is located.

3. The method of claim 2, wherein each of the first and second rigid members comprises:
   a first surface configured to contact the lower mold,
   a second surface opposite to the first surface, and
   a plurality of connection surfaces configured to connect the first surface to the second surface, and
   wherein the liquid polymer is injected into the second inner space to contact the second surface and the connection surfaces.

4. The method of claim 3, wherein the liquid polymer is filled into a region of the second inner space around the rigid members.

5. The method of claim 4, wherein a shape of the cover member corresponds to that of the second inner space.

6. A method of manufacturing a cover member, the method comprising:
   providing a plurality of rigid members formed of a transparent material and offset from one another, the plurality of rigid members defining a gap therebetween;
   forming a flexible member comprising:
      a plane part defining a first recess part;
      a first bent part bent from a first side of the plane part in a first direction and defining a second recess part; and
      a second bent part bent from a second side of the plane part in the first direction, the second bent part defining a third recess part;
      a portion configured to fill the gap of the plurality of rigid members; and
   coupling the plurality of rigid members to the first, second, and third recess parts to form the cover member, the cover member being a window of a display device.

7. The method of claim 6, wherein the flexible member is formed by injection-molding a polymer.

8. The method of claim 7, wherein each of the first and second recess parts has a depth that is substantially the same as a thickness of each of the plurality of rigid members.

* * * * *